United States Patent
Morishima et al.

(10) Patent No.: US 9,514,941 B2
(45) Date of Patent: Dec. 6, 2016

(54) LIQUID CRYSTAL DISPLAY DEVICE, MANUFACTURING METHOD THEREFOR, AND DEFECTIVE PIXEL CORRECTION METHOD THEREFOR

(71) Applicant: Panasonic Liquid Crystal Display Co., Ltd., Himeji-shi, Hyogo (JP)

(72) Inventors: Daisuke Morishima, Osaka (JP); Keiichirou Ashizawa, Osaka (JP); Hiroaki Iwato, Osaka (JP); Takashi Katou, Osaka (JP)

(73) Assignee: Panasonic Liquid Crystal Display Co., Ltd., Hyogo (JP)

( * ) Notice: Subject to any disclaimer, the term of this patent is extended or adjusted under 35 U.S.C. 154(b) by 66 days.

(21) Appl. No.: 14/199,192

(22) Filed: Mar. 6, 2014

(65) Prior Publication Data
US 2015/0153598 A1 Jun. 4, 2015

(30) Foreign Application Priority Data
Dec. 2, 2013 (JP) ................................. 2013-249442

(51) Int. Cl.
*G02F 1/136* (2006.01)
*H01L 21/268* (2006.01)
*H01L 27/12* (2006.01)
*G02F 1/1362* (2006.01)

(52) U.S. Cl.
CPC ....... *H01L 21/268* (2013.01); *G02F 1/136259* (2013.01); *H01L 27/1259* (2013.01); *G02F 2001/136254* (2013.01); *G02F 2001/136268* (2013.01)

(58) Field of Classification Search
CPC ............... G02F 1/136259; G02F 2001/136268
See application file for complete search history.

(56) References Cited

U.S. PATENT DOCUMENTS

| | | | | |
|---|---|---|---|---|
| 5,223,961 A | * | 6/1993 | Ukai | G02F 1/1309 349/47 |
| 2008/0042955 A1 | * | 2/2008 | Oke | G02F 1/134363 345/92 |
| 2010/0141861 A1 | * | 6/2010 | Wang | G02F 1/1343 349/54 |
| 2013/0299830 A1 | * | 11/2013 | Ishigaki | H01L 33/08 257/59 |
| 2013/0300969 A1 | * | 11/2013 | Kimura | G02F 1/133555 349/46 |

FOREIGN PATENT DOCUMENTS

JP 2009-151094 7/2009

* cited by examiner

*Primary Examiner* — Richard Kim
(74) *Attorney, Agent, or Firm* — Hamre, Schumann, Mueller & Larson, P.C.

(57) ABSTRACT

In a TFT substrate, a common signal line is arranged on top of a common electrode and below a pixel electrode through intermediation of an insulating film. The metal piece in a pixel having a bright spot is irradiated with laser from the rear surface side of the TFT substrate. The common electrode and the pixel electrode are short-circuited by the melted metal piece.

1 Claim, 5 Drawing Sheets

LIQUID CRYSTAL DISPLAY DEVICE, MANUFACTURING METHOD THEREFOR, AND DEFECTIVE PIXEL CORRECTION METHOD THEREFOR

CROSS-REFERENCE TO RELATED APPLICATION

The present application claims priority from Japanese application JP2013-249442 filed on Dec. 2, 2013, the entire content of which is hereby incorporated by reference into this application.

TECHNICAL FIELD

The present application relates to a liquid crystal display device, a manufacturing method therefor, and a defective pixel correction method therefor.

BACKGROUND

In a liquid crystal display panel of a liquid crystal display device, pixel circuits including thin film transistors (TFTs) and various kinds of wiring are formed on one of a pair of substrates sandwiching liquid crystal. Such substrate is hereinafter referred to as "TFT substrate". A large number of pixel regions are formed on a surface of the TFT substrate on the side facing the liquid crystal. Each pixel region includes a thin film transistor, a pixel electrode to which a video signal is supplied by the thin film transistor, and a common electrode to which a common potential is supplied.

However, when a failure such as a short circuit between a source electrode and a drain electrode occurs in the thin film transistor, a potential may be supplied constantly to the pixel electrode, which is a destination of electrical connection of the electrodes. As a result, in a so-called normally black liquid crystal display device, a stuck pixel as a pixel defect, namely a bright spot, may occur. A liquid crystal display device is desired to be capable of performing defective pixel correction reliably. A manufacturing method therefor, and a defective pixel correction method therefor are also desired to be capable of performing defective pixel correction reliably.

SUMMARY

In one general aspect, the instant application describes a liquid crystal display device including a TFT substrate which includes a thin film transistor, a first insulating film formed to cover the thin film transistor, a common electrode formed on top of the first insulating film and supplied with a common potential, a common signal line formed on top of the common electrode, a second insulating film formed to cover the common electrode, the common signal line, and the first insulating film, a pixel electrode formed on top of the second insulating film and having a potential controlled by the thin film transistor, and a metal piece. The metal piece is formed in the same layer as a layer in which the common signal line is formed, and is located in a region that overlaps with, in a cross section of the TFT substrate taken along a thickness direction thereof, at least a part of a region in which the common electrode and the pixel electrode are both present. The metal piece is made of the same metallic material as a metallic material of the common signal line.

The above general aspect may include one or more of the following features. For example, when the TFT substrate is viewed in plan, the metal piece may overlap completely with both the common electrode and the pixel electrode.

The metal piece may be formed to be integral with the common signal line and may extend in an in-plane direction from the common signal line.

The metal piece may be separated from the common signal line.

The first insulating film may have a double layer structure in which at least one of two layers is made of an organic material.

One of the two layers of the first insulating film on a side on which the common electrode is formed may be made of an organic material.

The liquid crystal display device according to the present application may include a pixel in which the pixel electrode and the common signal line are short-circuited.

In another general aspect, the instant application describes a manufacturing method for a liquid crystal display device including a TFT substrate which includes forming the TFT substrate, and irradiating the metal piece in a pixel found to have a defect with laser from a surface of the TFT substrate opposite to a surface having the pixel electrode formed thereon. In the forming the TFT substrate, the TFT substrate is formed so as to include a thin film transistor, a first insulating film formed to cover the thin film transistor, a common electrode formed on top of the first insulating film and supplied with a common potential, a common signal line formed on top of the common electrode, a second insulating film formed to cover the common electrode, the common signal line, and the first insulating film, a pixel electrode formed on top of the second insulating film and having a potential controlled by the thin film transistor, and a metal piece formed in the same layer as a layer in which the common signal line is formed, the metal piece being located in a region that overlaps with, in a cross section of the TFT substrate taken along a thickness direction thereof, at least a part of a region in which the common electrode and the pixel electrode are both present, the metal piece being made of the same metallic material as a metallic material of the common signal line.

The above general aspect may include one or more of the following features. For example, there is provided a defective pixel correction method for a liquid crystal display device including a TFT substrate, which includes forming the TFT substrate and irradiating the metal piece in a pixel found to have a defect with laser from a surface of the TFT substrate opposite to a surface having the pixel electrode formed thereon. The TFT substrate is formed so as to include a thin film transistor, a first insulating film formed to cover the thin film transistor, a common electrode formed on top of the first insulating film and supplied with a common potential, a common signal line formed on top of the common electrode, a second insulating film formed to cover the common electrode, the common signal line, and the first insulating film, a pixel electrode formed on top of the second insulating film and having a potential controlled by the thin film transistor, and a metal piece formed in the same layer as a layer in which the common signal line is formed, the metal piece being located in a region that overlaps with, in a cross section of the TFT substrate taken along a thickness direction thereof, at least a part of a region in which the common electrode and the pixel electrode are both present, the metal piece being made of the same metallic material as a metallic material of the common signal line.

These general and specific aspects may be implemented using a system, a method, or a computer program, or any combination of systems, methods, and computer programs.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

DETAILED DESCRIPTION

Figure 1:
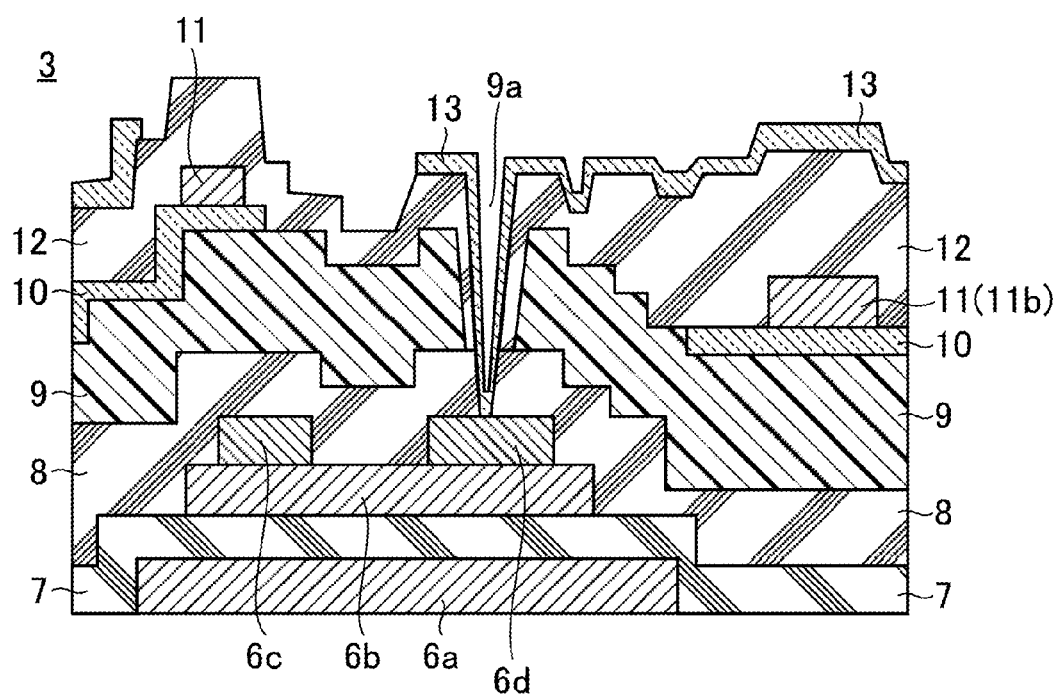
FIG. 1 illustrates an exemplary cross-sectional view of a TFT substrate according to one embodiment of the present application.
Figure 2:
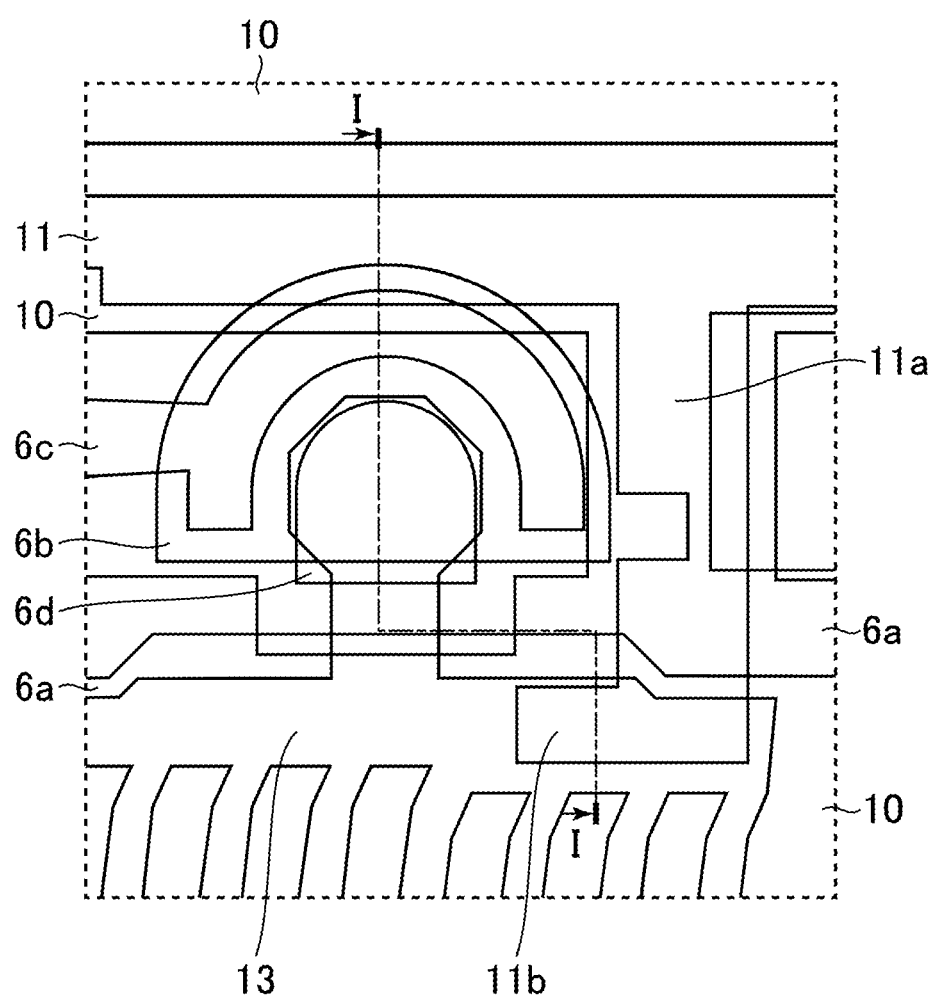
FIG. 2 illustrates an exemplary plan view of the TFT substrate shown FIG. 1.
Figure 6:
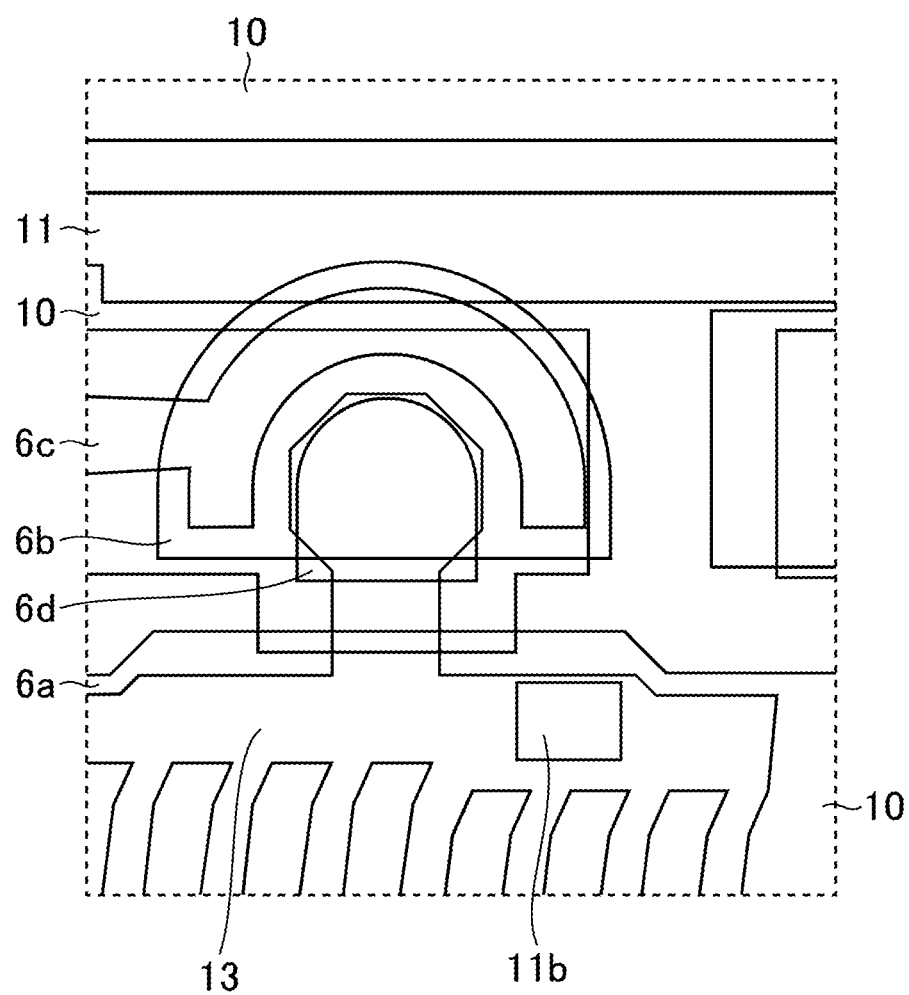
FIG. 6 illustrates another exemplary plan view of a TFT substrate.

One configuration of the present application is now described below with reference to FIG. 1, FIG. 2, and FIG. 6. First, FIG. 1 illustrates an exemplary cross-sectional view of a main portion of a TFT substrate 3, and FIG. 2 illustrates an exemplary plan view illustrating a TFT 6 of the TFT substrate 3 and its vicinity. Note that, FIG. 1 illustrates an exemplary cross-sectional view illustrating the cross section taken along the chain line I-I of FIG. 2 as viewed from the direction of arrows. FIG. 6 illustrates an exemplary plan view of a TFT substrate 3 similar to that of FIG. 1, in which a common signal line 11 is replaced by its modified example.

A liquid crystal display device 1 according to this configuration includes a liquid crystal display panel 2. The liquid crystal display panel 2 includes a TFT substrate 3 as a first substrate, a color filter (CF) substrate 4 as a second substrate, and a liquid crystal layer 5 sandwiched between the two substrates. The TFT substrate 3 includes a thin film transistor (TFT) 6 serving as a switching element for each pixel region. In the following, descriptions of photolithography, chemical vapor deposition (CVD), and sputtering are omitted because those are well-known arts.

The TFT substrate 3 is formed by laminating various kinds of layers and electrodes illustrated in FIG. 1 on a transparent substrate (not shown in FIG. 1) made of alkali-free glass or the like. FIG. 2 illustrates an exemplary plan view of the TFT substrate 3. First, as illustrated in FIG. 1, in the TFT substrate 3, a gate electrode 6a is formed directly on the transparent substrate which is a lowermost layer. The gate electrode 6a is formed by depositing a metal such as Cu and Al by sputtering and shaping the resultant layer by photolithography.

A gate insulating film 7 and a semiconductor layer 6b are formed on the gate electrode 6a in this order from the bottom, and a source electrode 6c and a drain electrode 6d are formed on the semiconductor layer 6b. Layers to be made into the gate insulating film 7 and the semiconductor layer 6b are deposited by chemical vapor deposition (CVD). The gate insulating film 7 is made of SiNx, and the semiconductor layer 6b is made of amorphous Si. The source electrode 6c and the drain electrode 6d are formed in the same layer, and metal films to be made into those electrodes are deposited by sputtering of Cu or Al. The respective layers deposited in the process described above are processed into a predetermined shape by photolithography.

Note that, the gate electrode 6a, the semiconductor layer 6b, the source electrode 6c, and the drain electrode 6d together construct the TFT 6, and when a gate potential is applied to the gate electrode 6a, the semiconductor layer 6b is brought into a conductive state in which a video signal is supplied from the source electrode 6c to the drain electrode 6d via the semiconductor layer 6b.

In order to cover the TFT 6 and the gate insulating film 7 described above, an insulating film 8 and an organic insulating film 9 covering the insulating film 8 are formed in this order from the bottom. The insulating film 8 is made of SiNx. A layer to be made into the insulating film 8 is deposited by CVD. A layer to be made into the organic insulating film 9 is formed by coating with an acrylic resin. By subjecting the two resultant layers to photolithography, the insulating film 8 and the organic insulating film 9 are formed. As illustrated in FIG. 1, a contact hole 9a is formed in the films of this double layer structure. A pixel electrode 13 extends downward through the contact hole 9a and comes into contact with the drain electrode 6d exposed at a bottom part of the contact hole 9a. Electrical conduction at this contact point enables the video signal transmitted to the drain electrode 6d to be supplied to the pixel electrode 13.

A common electrode 10 made of a transparent conductive material such as indium-tin oxide (ITO) is formed on the organic insulating film 9. A common signal line 11 made of Cu or Al is formed on the common electrode 10. Those members are both formed through sputtering and photolithography. In this case, the common signal line 11 illustrated in FIG. 2 includes an extending portion 11a that extends downward, and a metal piece 11b for short-circuiting, which is a small piece protruding to the left side from a distal end of the extending portion 11a. The layer illustrated as the common signal line 11 in FIG. 1 is a part corresponding to the metal piece 11b, and is present so as to be sandwiched by the common electrode 10 and the pixel electrode 13. As described later, the metal piece 11b melts with laser irradiation, and the pixel electrode 13 and the common electrode 10 are short-circuited by having the melted metal piece bonded to them.

In the above-mentioned example, the metal piece 11b serves as a part of the common signal line 11. In other words, the metal piece 11b and the common signal line 11 are electrically connected to each other. In such structure, the contact area between the common electrode 10 and the common signal line 11 is larger as compared to a modified example to be described in the next paragraph, and hence the resistance between the common electrode 10 and the common signal line 11 can be reduced.

However, as another example of this configuration, the extending portion 11a may not be provided in the common signal line 11 but the common signal line 11 and the metal piece 11b may be formed separately as independent members. In other words, the metal piece 11b may not serve as a part of the common signal line 11. Specifically, the metal piece 11b and the common signal line 11 are not electrically connected to each other. FIG. 6 is a plan view in which the common signal line 11 (including the extending portion 11a and the metal piece 11b) of FIG. 2 is replaced by such common signal line 11 and metal piece 11b. As illustrated in FIG. 6, the metal piece 11b is formed into an island shape, and is a member different from the common signal line 11. However, the common signal line 11 and the metal piece 11b are made of the same material (such as Cu and Al) and can therefore be manufactured in the same step.

An insulating film 12 is formed to cover the organic insulating film 9, the common electrode 10, and the common signal line 11. Similarly to the gate insulating film 7 and the insulating film 8, the insulating film 12 is made of SiNx and is also formed by CVD and photolithography. As illustrated in FIG. 1, the pixel electrode 13 is further formed on the insulating film 12. The pixel electrode 13 is made of a transparent conductive material such as ITO and formed by sputtering and photolithography.

In this configuration, the organic insulating film 9 made of an organic material such as an acrylic resin is included as the layer to be the base of the common electrode 10. In this configuration, other insulating films than the organic insulating film 9, specifically, the gate insulating film 7, the insulating film 8, and the insulating film 12 are each made of an inorganic material such as SiNx. Organic materials have a feature that their surface is smoother and they can be flattened more easily than such inorganic materials. When the common electrode 10 is formed on an organic material, it is considered that the flatness of the surface of the organic material may provide an advantage that the common electrode 10 can be formed more accurately than when the common electrode 10 is formed on an inorganic material. It is also considered that the organic material may reduce an influence of an external electric field on the pixel electrode 13 and the common electrode 10 owing to its high permittivity.

As exemplified by the structure in this configuration, when the metal piece 11b as a target of laser irradiation is present between the common electrode 10 and the pixel electrode 13, which are to be bonded by the melted metal piece 11b and short-circuited, the laser can be easily adjusted so that the melted metal piece 11b may be spread to both the common electrode 10 and the pixel electrode 13. This is considered to lead to higher accuracy of defective pixel correction. Further, the metal piece 11b is held in direct contact with the common electrode 10 out of the common electrode 10 and the pixel electrode 13, which are to be bonded and short-circuited. Consequently, the reliability of the defective pixel correction is further enhanced.

Further, the metal piece 11b is irradiated with laser from the side opposite to the side where the pixel electrode 13 is provided. In other words, the pixel electrode 13 to be bonded to the common electrode 10 is located at a travel destination of the radiated laser when viewed from the metal piece 11b. This is considered to lead to higher accuracy of the defective pixel correction.

In addition, in this configuration, as illustrated in FIG. 2, the metal piece 11b when viewed in plan overlaps with at least a part of the region in which the common electrode 10 and the pixel electrode 13 are both present. With the irradiation of laser at the overlapping portion, the melted metal piece 11b becomes more likely to reach both the common electrode 10 and the pixel electrode 13. Consequently, the common electrode 10 and the pixel electrode 13 can be short-circuited effectively.

Further, the metal piece 11b may overlap completely with the region in which the common electrode 10 and the pixel electrode 13 are both present. This expands a laser irradiation region of the metal piece 11b. Consequently, the common electrode 10 and the pixel electrode 13 can be short-circuited more accurately.

As described above, this configuration includes the case where the metal piece 11b for short-circuiting serves as a part of the common signal line 11 and the case where the metal piece 11b and the common signal line 11 are formed independently of each other as the modified example. In the case where the metal piece 11b serves as a part of the common signal line 11, that is, the case where the extending portion 11a is present without being omitted, the contact area between the common signal line 11 and the common electrode 10 is larger than that in the case where the metal piece 11b and the common signal line 11 are formed independently of each other. Thus, when attention is focused on a conduction path from the supply source of the common potential to the common electrode 10 via the common signal line 11, the resistance to current is considered to be decreased. Consequently, the reduction in voltage and the reduction in power consumption can be attained. However, when the metal piece 11b is regarded only as a short-circuiting member, even if the metal piece 11b is formed independently of the common signal line 11, the common electrode 10 and the pixel electrode 13 can be short-circuited with high accuracy. Consequently, the metal piece 11b may serve as a part of the common signal line 11 or may be formed independently of the common signal line 11.

Figure 3:
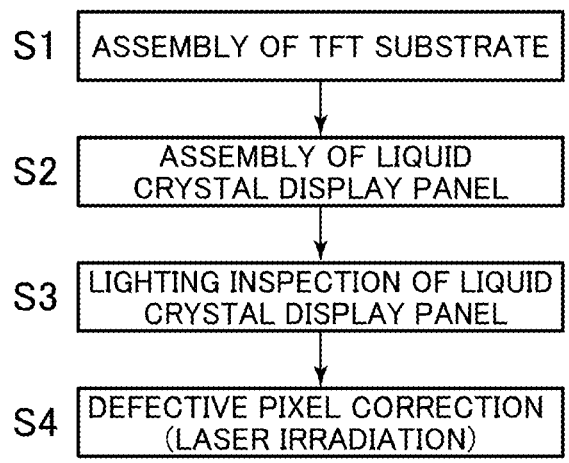
FIG. 3 illustrates an exemplary flowchart illustrating steps from assembly of the TFT substrate to defective pixel correction shown FIG. 1.
Figure 4:
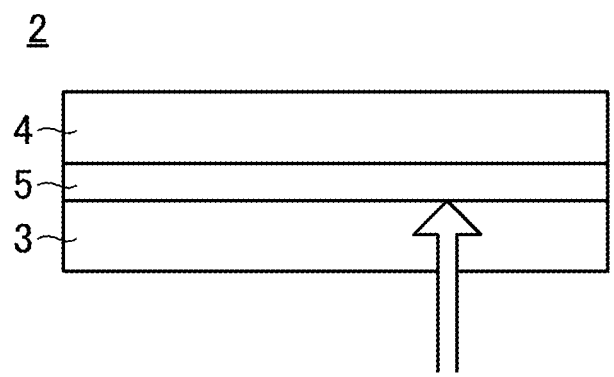
FIG. 4 illustrates an exemplary cross-sectional view of a liquid crystal display panel schematically illustrating how to perform laser irradiation shown FIG. 1.

Next, the defective pixel correction of the TFT substrate 3 according to this configuration is specifically described with reference to FIG. 1 and FIGS. 3 to 5. First, the flow until the defective pixel correction in steps of manufacturing a liquid crystal display device is described with reference to a flowchart of FIG. 3. As illustrated in FIG. 3, first, the TFT substrate 3 is assembled (S1). After the TFT substrate 3 is assembled (S1), the liquid crystal layer 5 is sandwiched by the TFT substrate 3 as the first substrate and the CF substrate 4 as the second substrate, thereby assembling the liquid crystal display panel 2 (S2). After the liquid crystal display panel 2 is assembled, lighting inspection is performed on all pixels in order to find a pixel defect (S3). Defective pixel correction by laser irradiation is performed on a bright spot found in the inspection (S4). FIG. 4 schematically illustrates how to perform the laser irradiation (S4) on the liquid crystal display panel 2. As illustrated in FIG. 4, the TFT substrate 3 side of the liquid crystal display panel 2 is irradiated with laser.

In the first place, the main cause for a bright spot in pixels is a short circuit between the source electrode 6c and the drain electrode 6d of the TFT 6. The short circuit allows a potential to be constantly supplied to the pixel electrode 13, and this pixel becomes a stuck pixel, namely a bright spot. As a step of correcting the bright spot, the defective pixel correction is performed by laser irradiation. The laser irradiation is performed in a manner that the metal piece 11b (common signal line 11) on the right side in FIG. 1 is irradiated with laser from the rear surface side of the TFT substrate 3, that is, from the side opposite to the side where the pixel electrode 13 is provided, specifically, from the bottom to the top in FIG. 1.

Figure 5:
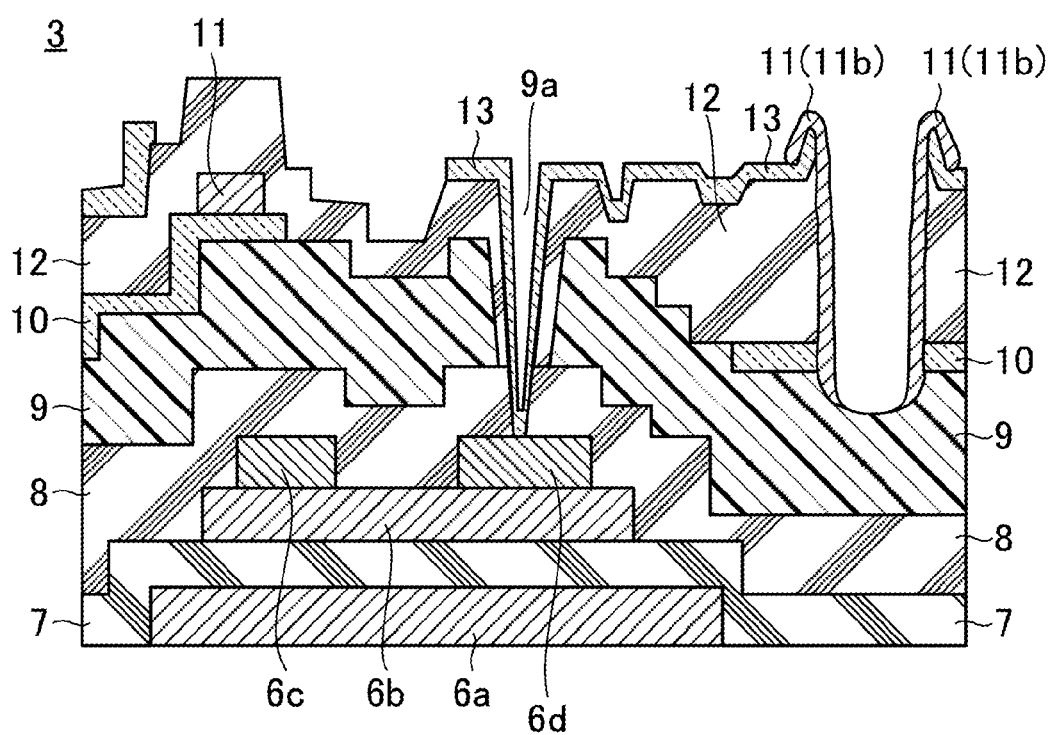
FIG. 5 illustrates an exemplary cross-sectional view of the TFT substrate after the laser irradiation shown FIG. 1.

FIG. 5 illustrates an exemplary cross section of the TFT substrate 3 after the laser irradiation (cross section similar to the cross section of FIG. 1). As illustrated in FIG. 5, the metal piece 11b made of metal melts with heat generated by the laser irradiation, and the heat of the melted metal piece 11b melts the surrounding layers including the pixel electrode 13, the insulating film 12, and the common electrode 10, thereby forming a hole therein. The melted metal piece 11b adheres onto an inner wall of the hole to short-circuit the pixel electrode 13 and the common electrode 10, and the formation of an electric field between the two electrodes is stopped. Then, a bright spot is changed to a dark spot.

Note that, the gate insulating film 7, the insulating film 8, the organic insulating film 9, and the common electrode 10, through which the laser passes before reaching the metal piece 11b, and the insulating film 12 and the pixel electrode 13 are each transparent and hardly interfere with the laser, and hence high heat is not generated in those members. However, heat is generated in the metal piece 11b made of metal because the metal piece 11b absorbs a part of energy of the laser. This heat melts the members surrounding the metal piece 11b.

While what has been described above is one configuration of the present application, the structure in the configuration is merely illustrative and various modifications may be freely made depending on the application and situation.

While the foregoing has described what are considered to be the best mode and/or other examples, it is understood that various modifications may be made therein and that the subject matter disclosed herein maybe implemented in various forms and examples, and that they may be applied in numerous applications, only some of which have been described herein. It is intended by the following claims to claim any and all modifications and variations that fall within the true scope of the present teachings.

What is claimed is:
1. A liquid crystal display device, comprising:
a TFT substrate;
the TFT substrate comprising:
 a thin film transistor;
 a first insulating film formed to cover the thin film transistor;
 a common electrode formed on top of the first insulating film and supplied with a common potential;
 a common signal line formed on top of the common electrode;
 a second insulating film formed to cover the common electrode, the common signal line, and the first insulating film;
 a pixel electrode formed on top of the second insulating film and having a potential controlled by the thin film transistor; and
 a metal piece formed in the same layer as a layer in which the common signal line is formed,
 the metal piece being located in a region that overlaps with, in a cross section of the TFT substrate taken along a thickness direction thereof, at least a part of a region in which the common electrode and the pixel electrode are both present,
 the metal piece being made of the same metallic material as a metallic material of the common signal line,
 the metal piece being separate from the common signal line, and being electrically connected to the common electrode, and
 the metal piece being surrounded by the second insulating film except where the metal piece is electrically connected to the common electrode.

* * * * *